United States Patent [19]

Volejnik

[11] Patent Number: 5,426,672
[45] Date of Patent: Jun. 20, 1995

[54] PROCESS AND DEVICE FOR TIMING RECOVERY

[75] Inventor: Wilhelm Volejnik, Sauerlach, Germany

[73] Assignee: Siemens Aktiengesellschaft, Munich, Germany

[21] Appl. No.: 920,433

[22] PCT Filed: Dec. 4, 1991

[86] PCT No.: PCT/EP91/02090

§ 371 Date: Aug. 14, 1992

§ 102(e) Date: Aug. 14, 1992

[87] PCT Pub. No.: WO91/12678

PCT Pub. Date: Aug. 22, 1991

[30] Foreign Application Priority Data

Feb. 16, 1990 [DE] Germany ............... 90 103 071.8

[51] Int. Cl.[6] ............... H04L 7/00; H04L 25/36; H04L 25/40
[52] U.S. Cl. ............... 375/371; 375/376; 370/102; 370/105.3; 370/108; 327/299; 327/553
[58] Field of Search ............... 370/105.3, 108, 102, 370/103; 375/118, 120; 307/510, 511, 521

[56] References Cited

U.S. PATENT DOCUMENTS

| 4,019,143 | 4/1977 | Fallon et al. | 328/71 |
| 4,563,657 | 1/1986 | Qureshi et al. | 331/25 |
| 4,608,702 | 8/1986 | Hirzel et al. | 375/118 |
| 4,709,170 | 11/1987 | Li | 307/511 |
| 4,780,891 | 10/1988 | Guérin et al. | 375/118 |
| 4,803,680 | 2/1989 | Rokugo et al. | 370/102 |
| 4,941,156 | 7/1990 | Stern et al. | 375/118 |
| 5,017,801 | 5/1991 | Lang | 307/269 |
| 5,131,013 | 7/1992 | Choi | 370/102 |
| 5,146,477 | 9/1992 | Cantoni et al. | 370/102 |

FOREIGN PATENT DOCUMENTS

| 536046 | 4/1973 | Austria . |
| 0084675 | 8/1983 | European Pat. Off. . |
| 1242457 | 8/1971 | United Kingdom . |

OTHER PUBLICATIONS

"Theorie und Anwendungen des Phase-locked Loops", Dr. Roland Best, AT Verlag Aarau, Stuttgart, Germany (1987), pp. 93–95.

"Annex A To Recommendation G. 706", CCITT, Melbourne, Australia (1988), pp. 107–174.

Primary Examiner—Stephen Chin
Assistant Examiner—Amanda T. Le
Attorney, Agent, or Firm—Hill, Steadman & Simpson

[57] ABSTRACT

In byte-wise stuffing of synchronous signals of the synchronous digital multiplex hierarchy, jitter which complicates timing recovery occurs with phase-jumps of 8 UI. A possibility is therefore sought of converting jitter into drift. This is achieved using a phase-locked loop (PLL) in which a phase-jump compensator (7) is inserted between the output (4) of a phase discriminator (3) and the input (5) of an oscillator (6). The phase-jump compensator converts an input correcting quantity ($K_e$) into an output correcting quantity ($K_a$). When no stuffing is being performed, the input correcting quantity ($K_e$) leaves the phase-jump compensator (7) unchanged (a1, b1). If positive stuffing (+St) is being performed, the pulses, thereby lengthened, of the input correcting quantity ($K_e$) are firstly shortened to the standard duration (x1) and subsequently lengthened in a stepwise fashion to the original duration (c1, d1). In the case of negative stuffing (−St), by contrast, the pulses, thereby shortened, of the input correcting quantity ($K_e$) are firstly lengthened to the standard duration (x1) and then once again shortened in a stepwise fashion (e 1, f1).

22 Claims, 6 Drawing Sheets

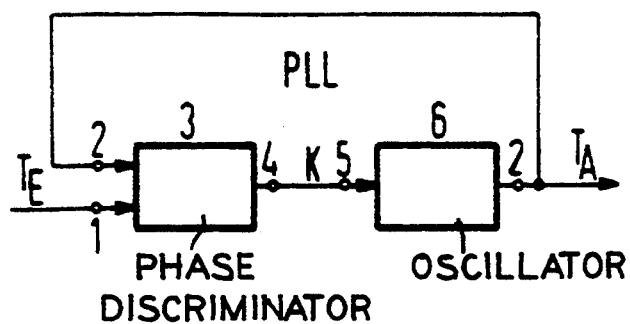
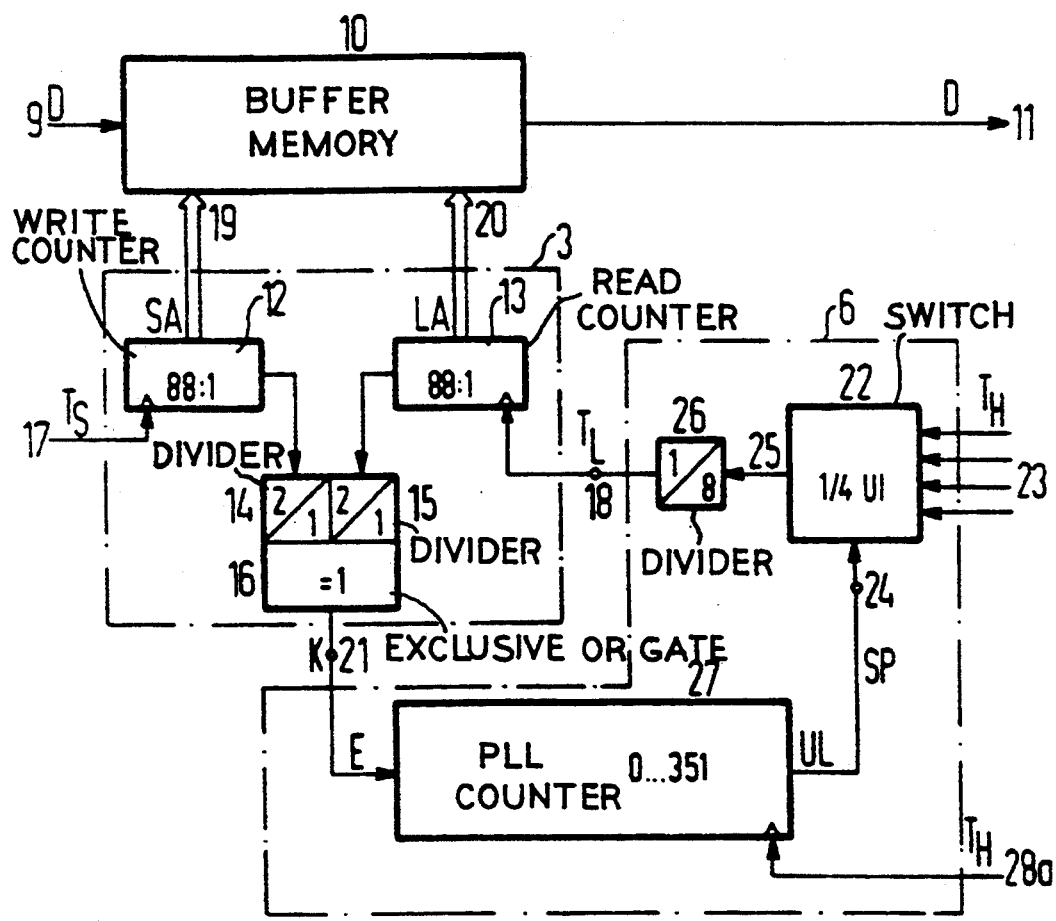

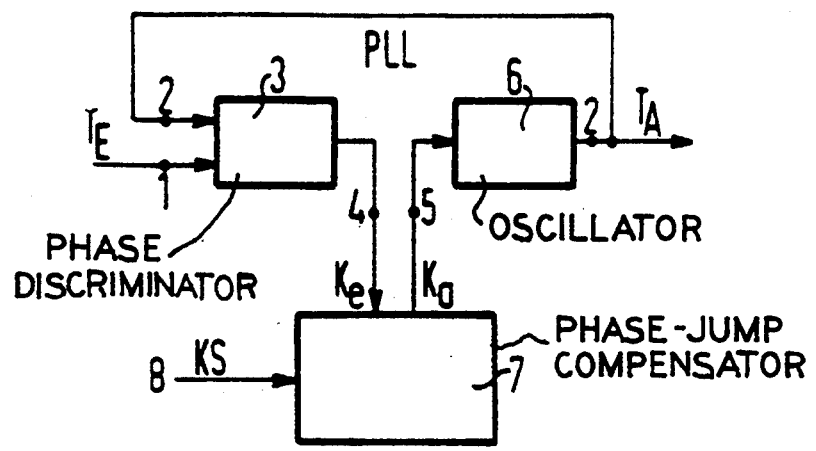
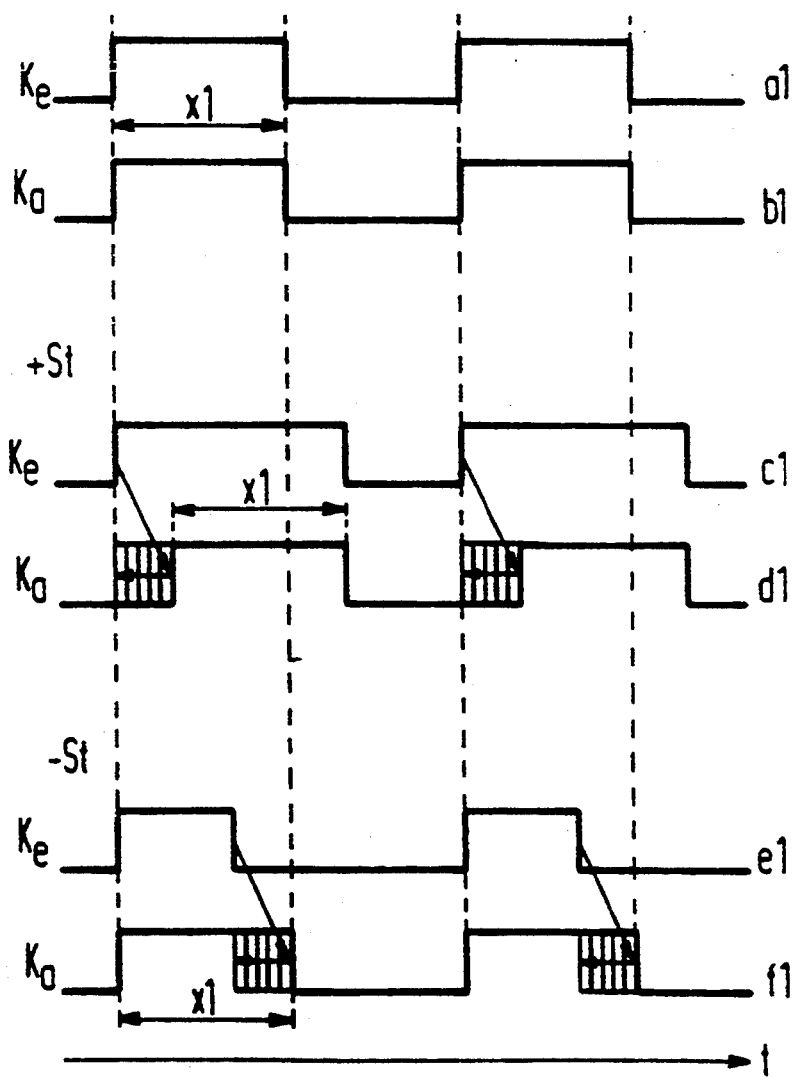

FIG 5
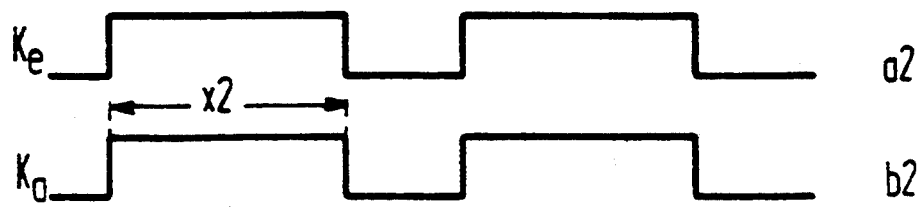
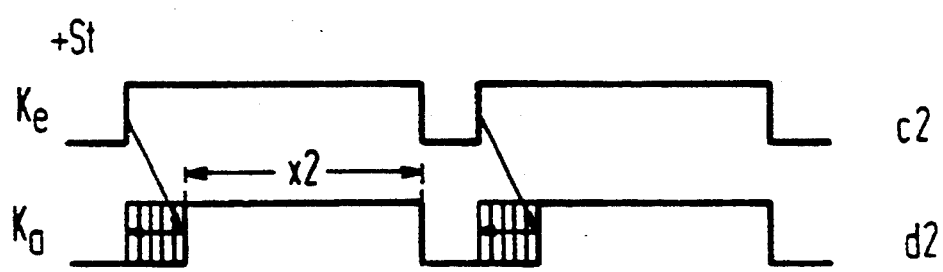
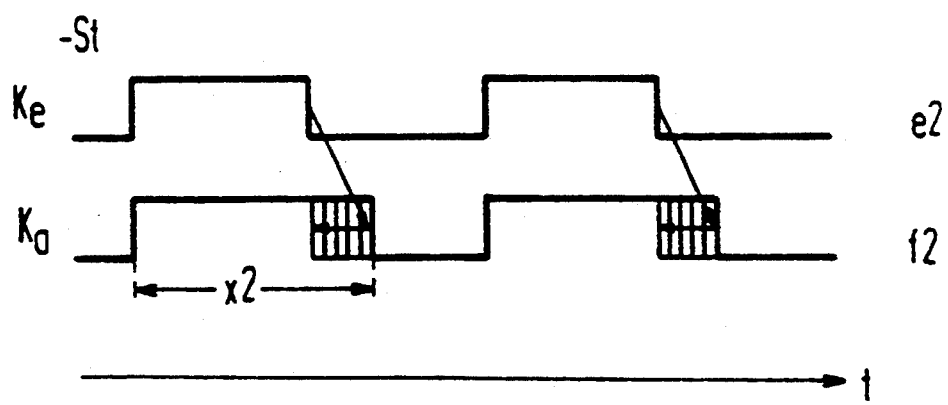

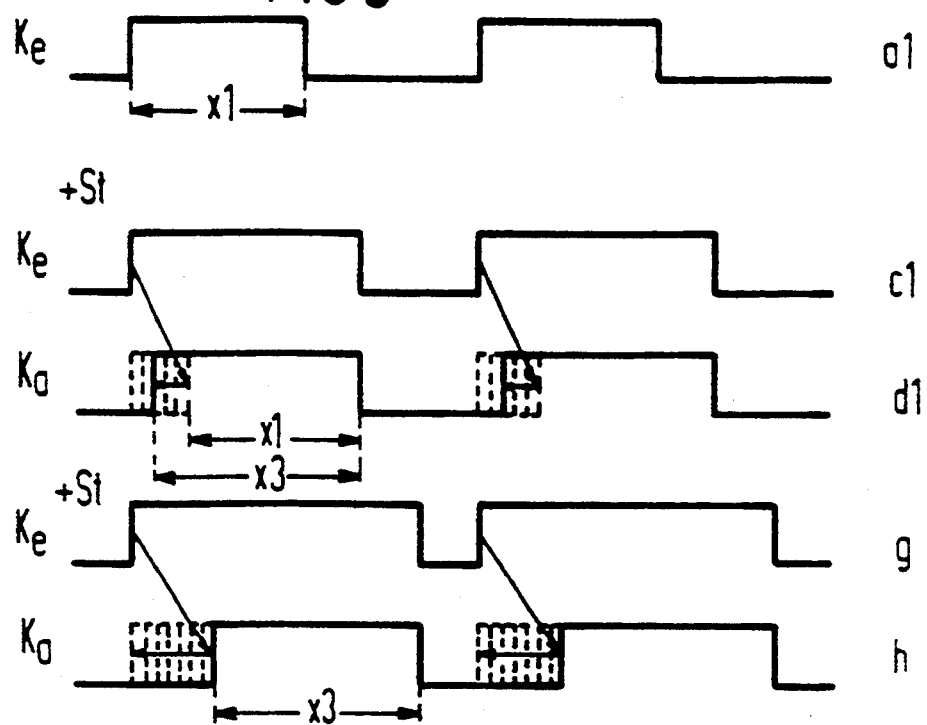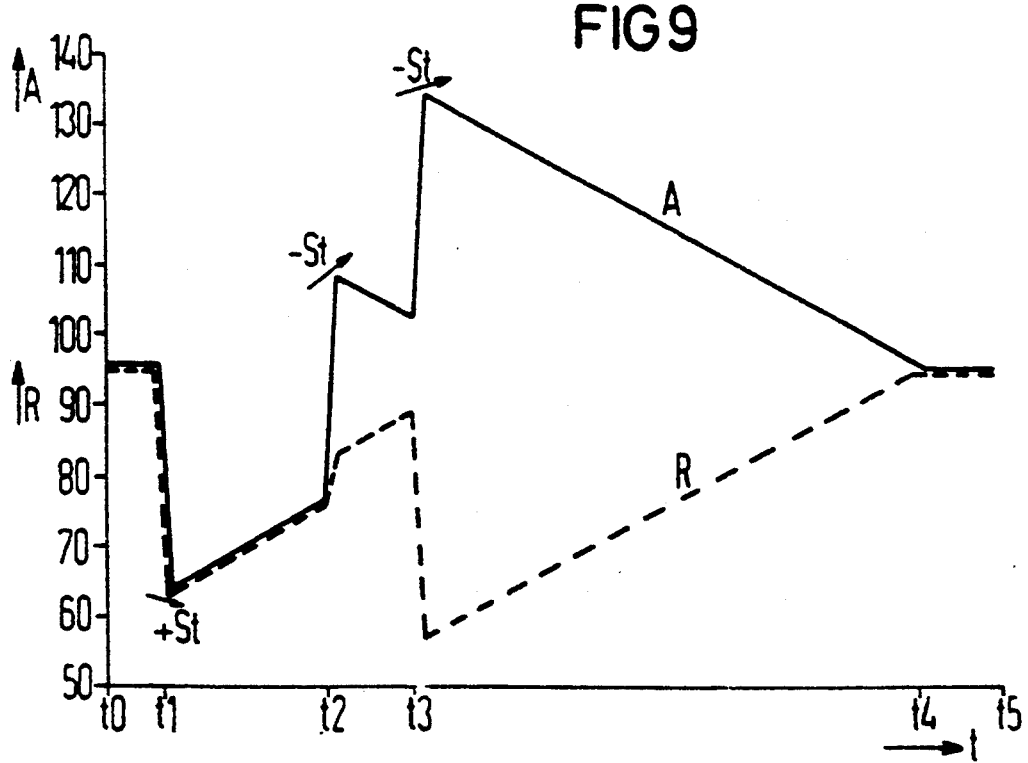

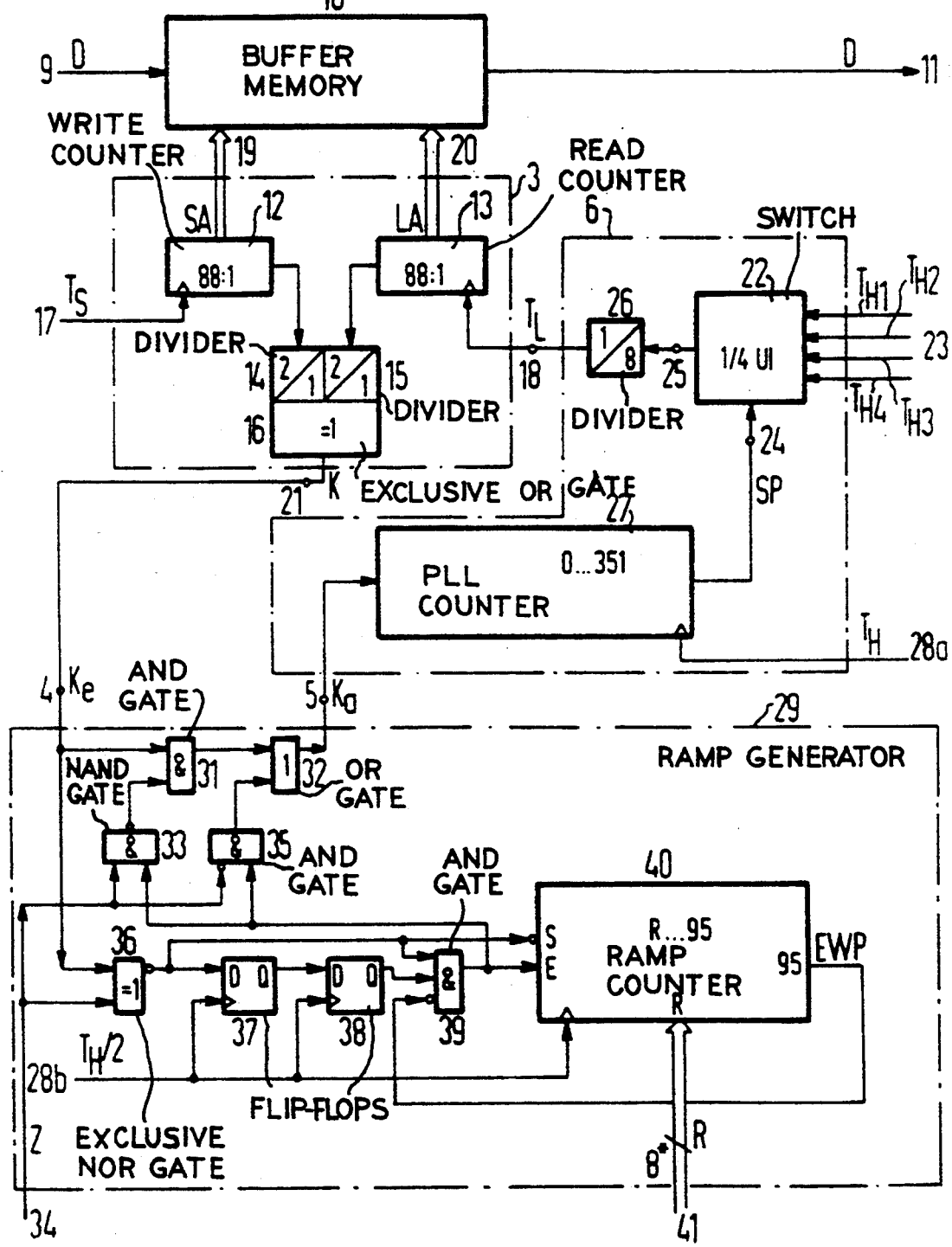

PROCESS AND DEVICE FOR TIMING RECOVERY

BACKGROUND OF THE INVENTION

The invention relates to a process for timing recovery in which the phase of an input clock pulse is compared with that of an output clock pulse, and in which the frequency of the output clock pulse is readjusted as a function of the result of comparison with the aid of a correcting quantity, and to a device for carrying out this process.

Such a process is known from the book "Theorie und Anwendungen des Phase-locked Loops", Best, 4th revised edition, AT Verlag Aarau, Stuttgart, 1987, pages 93 to 95.

A timing recovery device having a phase-locked loop, in which there is derived from the frequency of a quartz oscillator a sequence of phase-shifted internal clock pulses of which in each case one serves, controlled by the output signals of a phase discriminator, as readout pulse after frequency division, is the subject of U.S. Pat. No. 5,017,801.

A changeover is presently taking place in the technology of the transmission and multiplexing of digital signals from a plesiochronous to a synchronous operation. Whereas the conventional plesiochronous signals have a bit structure, the new synchronous signals have a byte structure, that is to say are organized in multiples of eight bits. This emerges from the CCITT Recommendations G.707, G.708 and G.709.

In multiplex technology, a plurality of digital signals are combined by interleaving to form a time-division multiplex signal. In the synchronous digital multiplex hierarchy this takes place in accordance with the byte structure in groups of respectively eight bits. Since the phases of the digital signals to be interleaved are frequently not fixed relative to one another, but drift with respect to one another as a function of the prehistory, it is necessary during interleaving to connect upstream phase matching.

The phase matching is performed by stuffing. In this case, in prescribed discrete time positions (time slots) of the outgoing multiplex signal either eight time slots assigned to the signal to be multiplexed are filled with its data or not—as a function of the instantaneous phase or frequency of the signal to be multiplexed relative to the multiplex signal. During stuffing, the phase of the synchronous signal to be multiplexed jumps accordingly by eight UI (unit intervals), or by one byte (8 bits), relative to the multiplex signal.

After transmission, the multiplex signal is once again resolved into its individual components. One of the problems thereby arising is the recovery of the original clock pulses of the multiplexed signals, for high demands are placed on the uniformity of these recovered clock pulses.

Irregularities occurring in the temporal sequence of the clock pulse edges are referred to as jitter. Since the jitter generated in different transmission links add together in their series connection, the jitter occasioned by individual causes must be narrowly limited. This also applies to the jitter that is caused by stuffing-induced phase-jumps.

A peculiarity of the transmission of digital signals resides in that phase fluctuations proceeding very slowly, so-called drift, are effectively tolerated by the transmission devices. Its permissible limiting values are therefore substantially higher than those of jitter.

SUMMARY OF THE INVENTION

The object of the invention is for the jitter generated during stuffing to be converted into drift during the recovery of the original clock pulse of the multiplexed signal in the multiplexer.

According to the invention, this object is achieved in a process of the type described in the introduction when the sudden changes in the correcting quantities are suppressed.

In general, the process of the invention is for timing recovery for received and intermediately stored data which has been matched to the transmission speed by stuffing processes. In the process the phase of an irregular write clock pulse is compared with the phase of a continuous read clock pulse obtained in a phase-locked loop and the frequency of the read clock pulse is controlled as a function of the result of comparison by means of an input correcting quantity which is fed to a controllable oscillator. There is determined from the stuffing information of the received data a compensation control signal for a stuffing process being performed, which stuffing process causes a sudden change in the correcting quantity. The compensation control signal is fed to a phase-jump compensator which determines from the input correcting quantity fed to it an output correcting quantity which controls the oscillator and which first suppresses sudden changes in the output correcting quantity and then matches the output correcting quantity continuously or in small steps to the input correcting quantity. The phase-jump compensator generates a compensation signal which is combined with the input correcting quantity to form the output correcting quantity. The rate of change of the output correcting quantity is determined by the input correcting quantity caused by stuffing processes. A binary pulse-pause sequence is generated as the input correcting quantity. In the event of a lengthening of a binary state of the input correcting signal by a stuffing process the leading edge of this binary state is first delayed by the compensation signal, and in the event of a shortening of the one binary state of the input correcting signal by a stuffing process the trailing edge of this binary state is firstly delayed by the compensation signal, so that in both cases the pulse-pause ratio remains at first at least approximately the same. Then in both cases the delay interval of the edges is reduced.

The process is carried out by a timing recovery device for data which is input by an irregular write clock pulse into a buffer memory and read out by a continuous read clock pulse generated in a phase-locked loop containing a controllable oscillator and a phase discriminator. A digital oscillator is provided whose frequency is controlled via the counting period of a PLL counter. A phase discriminator having a write counter and a read counter is provided, from whose output signals a binary pulse-pause sequence is obtained as the correcting signal. A ramp generator having an adjustable ramp counter is provided, a ramp generator control device is provided which during each stuffing process adjusts the ramp counter which transmits a compensation signal corresponding to its counting period, which is combined via a gate network with the input correcting quantity of the phase discriminator and transmits an output correcting signal fed to the oscillator. The ramp generator control device then reduces the compensation signal in a stepwise fashion by reducing the counting period of the ramp counter, and after termination of the counting process transmits a final value pulse which switches through the input correcting quantity as the output correcting quantity to the oscillator. There is provided in the ramp generator control device an adjustable initial value counter, upstream of whose adjusting inputs a full adder is connected and whose counter reading is increased or decreased during each stuffing process by a constant amount. The counter reading determines the adjustment value of the ramp counter and changes the adjustment value in a stepwise fashion between the stuffing processes. Connected upstream of the clock pulse input of the initial value counter is a switchable divider whose division ratio can be switched as a function of the counter reading of the initial value counter and thereby effects changes of different rapidity in the compensation signal.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, and in which:

FIG. 1 shows a block diagram of a known timing recovery device,

FIG. 2 shows the block diagram of the timing recovery device according to the invention, FIG. 3 shows a prior proposal for a timing recovery device, FIG. 4 shows first pulse diagrams for explaining the invention, FIG. 5 shows second pulse diagrams for explaining the invention, FIG. 6 shows third pulse diagrams for explaining the invention, FIGS. 7+8 show the timing recovery device according to the invention, and FIG. 9 shows a diagram for explaining the timing recovery device according to FIGS. 7 and 8.

DESCRIPTION OF THE PREFERRED EMBODIMENT

Figure 8:
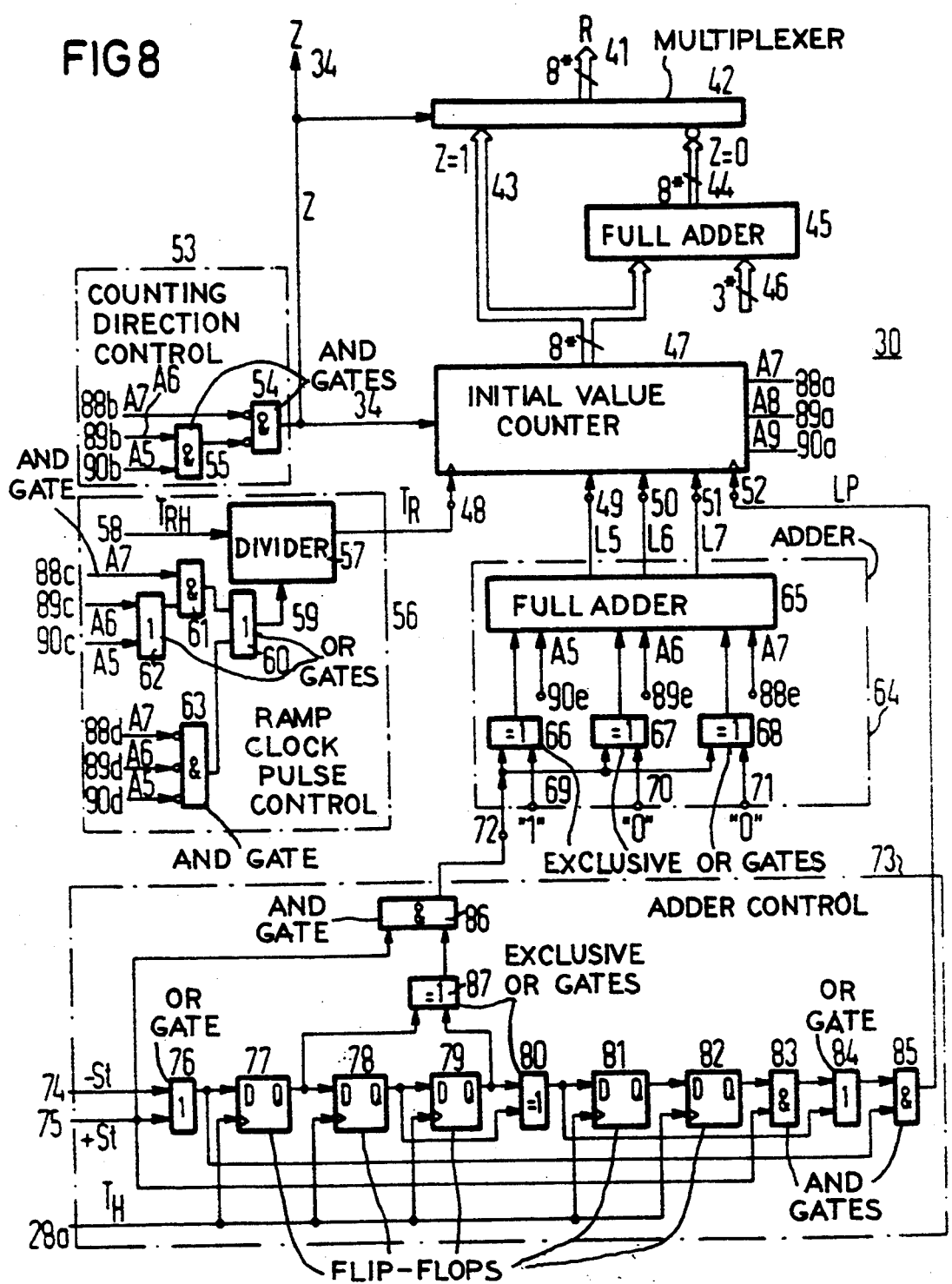

FIG. 1 shows the block diagram of a known timing recovery device in the form of a phase-locked loop PLL. It contains a phase discriminator 3 and an oscillator 6.

The input clock pulse $T_E$ is applied at the input 1 of the phase discriminator 3 and the output clock pulse $T_A$ at its input 2. The phase discriminator 3 then transmits a correcting quantity K at its output 4 as a function of the phase difference between the input clock pulse $T_E$ and the output clock pulse $T_A$. The oscillator 6 is influenced by said correcting quantity in such a way that the output clock pulse $T_A$ generated by it follows the input clock pulse $T_E$ in frequency.

The dimension of the correcting quantity K depends on the realization of the circuit. In the case of analog phase-locked loops, it has, for example, the dimension of a voltage, and the oscillator is a voltage-controlled oscillator.

In many applications, the correcting quantity K is fed to the oscillator 6 via a filter. However, this is unimportant for the invention.

A phase-jump of the input clock pulse $T_E$ is followed by the phase of the output clock pulse $T_A$ with a delay whose magnitude depends on the dimensioning of the phase-locked loop. Rapidly proceeding phase changes in the input clock pulse $T_E$ are retarded towards the output and compensated. It is for these reasons that timing recovery devices of high quality contain such phase-locked loops. In the realization, limits are set to the magnitude of the said delay and thus to the degree of compensation, that is to say the quality of the phase-locked loop. These limits do not allow the quality of the phase-locked loops to be advanced so high that the phase-jumps, governed by byte stuffing, for the input clock pulse $T_E$ can be sufficiently retarded towards the output, that is to say converted into drift.

FIG. 2 shows the block diagram of the timing recovery device according to the invention. This differs from the known block diagram according to FIG. 1 by the insertion of a phase-jump compensator 7 whose input is connected to the output 4 of the phase discriminator 3 and whose output is connected to the input 5 of the oscillator 6. This phase-jump compensator 7 receives a correcting quantity $K_e$ and transmits a correcting quantity $K_a$. A compensation control signal KS is applied to a control input 8 of the phase-jump compensator 7.

The phase-jump compensator 7 acts in principle such that it compensates a phase-jump, caused by stuffing, in the input clock pulse $T_E$ and the sudden change generated thereby in the correcting quantity $K_e$ towards the output 5 in such a way that the correcting quantity $K_a$ is not changed by the phase-jump. This holds for the time during and immediately after the phase-jump. As time advances, the compensating action of the phase-jump compensator 7 is reduced continuously or in small steps until it is no longer present after a compensation time which depends on the construction of the phase-jump compensator 7. Since the frequency of the oscillator 6, and thus the phase of the output clock pulse $T_A$ are determined by the correcting quantity $K_a$, the phase matching of the output clock pulse $T_A$ after a phase-jump, occasioned by stuffing, in the input clock pulse $T_E$ is distributed over the compensation time prescribed by the phase-jump compensator 7. Dimensioning for very long compensation times, for example of a few seconds, can be achieved without difficulty. The process according to the invention therefore offers a simple possibility of converting stuffing jitter into drift.

In the exemplary embodiment of the invention shown in FIGS. 7 and 8, the phase discriminator 3 and the digital oscillator 6 are used in accordance with the above mentioned prior proposal. The latter is shown in FIG. 3. The phase discriminator 3 contains there a write counter 12 (88:1), a read counter 13 (88:1), a 2:1 divider 14 and 15 and an exclusive OR gate 16. The oscillator 6 comprises a phase changeover switch 22, an 8:1 divider 26 and a PLL counter 27.

Data D which arrive at the input 9 with a very irregular phase response are passed on at the output 11 with a smoothed phase response. For this purpose, the incoming data D are input into a buffer memory 10. The associated very irregular data clock pulse or input clock pulse $T_E$ advances the write counter 12 by one with each clock pulse period. The input clock pulse $T_E$, is therefore denoted below by the write clock pulse $T_S$. It is present at the write clock pulse input 17. The write counter 12 determines via a bus 19 the write address SA of the buffer memory 10, into which a data is input. The output clock pulse $T_E$ of the outgoing data D, which is now denoted by the read clock pulse $T_L$, advances the read counter 13. The latter determines via a bus 20 from which read address LA of the buffer memory 10 a data is read out. The capacity of the write counter 12 and that of the read counter 13 corresponds to the number of the memory locations available in the buffer memory 10. The write counter 12 and the read counter 13 restart after each pass with their initial value at zero. The difference of their counter readings reflects the occupancy of the buffer memory 10. The greater this difference, the fuller the buffer memory 10. This difference is converted via the 2:1 dividers 14 and 15 and the exclusive OR gate 16 into a pulse-pause sequence whose pause component increases in proportion to the counter difference. This pulse-pause sequence corresponds to the correcting quantity K in FIG. 1.

The PLL counter 27 receives at the auxiliary clock pulse input 28a an auxiliary clock pulse $T_H$ which advances the counter 27 by one in each case with its rising or falling clock pulse edges. The advancement of the counter 27 is stopped during the pause of the pulse-pause sequence. It restarts after one pass with its initial value at zero. Since it is stopped during a pause of the above mentioned pulse-pause sequence, its pass lasts longer the more the buffer memory 10 is filled. It lasts shorter, that is to say the frequency of the passes is higher, the less said buffer memory is filled.

The phase changeover switch 22 is fed via its inputs 23 four phases $T_H1$ to $T_H4$ of the auxiliary clock pulse $T_H$, offset by 90° in each case, whose frequency is slightly higher than the eightfold nominal value of the read clock pulse $T_L$. One of these phase is switched through to the output 25 of the phase changeover switch 22. A switching pulse SP arriving at the switching input 24 effects a changeover to the adjacent phase of the auxiliary clock pulse $T_H$ in such a way that a clock pulse period of the outgoing auxiliary clock pulse $T_H$ appears at the output 25 temporarily delayed by 90° ($\frac{1}{4}$ UI). Consequently, successive switching pulses SP on average effect a retardation of the auxiliary clock pulse $T_H$ transmitted by the phase changeover switch 22. Said auxiliary clock pulse produces the read clock pulse $T_L$ after division in the 8:1 divider 26.

The switching pulses SP are transmitted by the PLL counter 27 once per pass in each case, for example at the end of the pass during the resetting. The shorter the pass times of the PLL counter 27, the more frequent also are the switching pulses SP and the slower becomes the mean frequency of the read clock pulse $T_L$. The frequency of the switching pulses SP or the frequency of the passes of the PLL counter 27 is, as already explained, higher the lower the occupancy of the buffer memory 10. On the other hand, this effects a retardation in the read clock pulse $T_L$ via the phase changeover switch 22. Since the write clock pulse $T_S$ remains unaffected hereby, the buffer memory 10 begins to fill until a state of equilibrium is set up between the occupancy of the buffer memory 10 and the frequency of the read clock pulse $T_L$.

FIG. 4 shows the principle of the mode of operation of the invention. The symmetric pulse-pause sequence a1 is the correcting quantity $K_e$ at the output 4 of the phase discriminator 3. The time segment considered was preceded by a relatively long time without stuffing processes. The phase-jump compensator 7 then passes the correcting quantity $K_e$ unchanged to the output 5. The pulse-pause sequences a1 and b1 are therefore identical. In this state, the phase-jump compensator 7 has no effect; no modulation takes place.

After positive stuffing +St, the pulse-pause sequence a1 of the correcting quantity $K_e$ is changed into the form of a pulse-pause sequence c1. The phase of the write clock pulse has been delayed due to stuffing, as a result of which the falling edges of the pulse-pause sequence c1 of the correcting quantity $K_e$ are also delayed. The pulses become wider and the pauses correspondingly shorter. The phase-jump compensator 7 now delays the rising edges of the pulse-pause sequence d1 of the correcting quantity $K_a$ by precisely the amount by which the falling edge was delayed due to stuffing. Consequently, the pulse duration x1 of the pulse-pause sequence d1 of the correcting quantity $K_a$ firstly remains unchanged, and thus also do the oscillator frequency and the phase of the read clock pulse $T_L$. Subsequently, the delay in the rising edge of the pulse-pause sequence d1 of the correcting quantity $K_a$ is cancelled in small steps, as a result of which the phase of the read clock pulse $T_L$ is slowly shifted. Upon expiry of the compensation time, the edges of the pulse-pause sequences c1 and d1 correspond once again; the phase-jump compensator 7 switches the correcting quantity $K_e$ through to the output.

After negative stuffing −St, the sequences take place correspondingly, as the pulse-pause sequences e1 and f1 show. The phase of the write clock pulse leads due to stuffing, as a result of which the falling edges of the correcting quantity $K_e$ are shifted forward temporarily. The phase-jump compensator 7 delays the falling edge of the correcting quantity $K_a$ precisely by the same amount, as a result of which its pulse duration and pause duration firstly remain unchanged. The further sequence takes place as in the case of positive stuffing +St.

The phase-jump compensator 7 thus converts phase-jumps into a phase change rising slowly in the shape of a ramp.

FIG. 5 shows the processes, described with the aid of FIG. 4, with the pulse-pause sequence a2 to f2 for an asymmetrical pulse-pause sequence a2 with a pulse duration of x2.

FIG. 6 shows the pulse-pause sequences a1, c1 and d1 according to FIG. 4. Whereas, however, in the pulse-pause sequence d1 the compensation is not yet concluded and the pulse duration is precisely x3, a new positive stuffing takes place and the correcting quantity $K_e$ assumes the pulse-pause sequence g. A longer compensation must now take place for the correcting quantity $K_a$ in the pulse-pause sequence h.

FIGS. 7 and 8 together show the timing recovery device according to the invention. At the top, FIG. 7 contains the timing recovery device already shown in FIG. 3, and at the bottom a ramp generator 29 as part of the phase-jump compensator 7. FIG. 8 shows with a ramp generator control device 30 a part of the phase-jump compensator 7 still missing in FIG. 7. FIG. 9 shows a diagram to explain the process sequence.

The ramp generator 29 in FIG. 7 contains AND gates 31, 35 and 39, an OR gate 32, a NAND gate 33, an exclusive NOR gate 36, D-type flip-flops 37 and 38, and a ramp counter 40. The retardation of the edges previously described takes place in the ramp generator 29. The designation "ramp generator" is based on the ramp-shaped rising phase change generated by it. The numbers named below can largely be changed.

The pulse-pause sequence of the correcting quantity $K_e$ at input 4 is led to the output 5 via the AND gate 31 and the OR gate 32, to the extent that the latter are conductive. The ramp counter 40 is advanced by an auxiliary clock pulse of half frequency $T_H/2$ at the auxiliary clock pulse input 28b. If its counter reading reaches the final value of EW=95, it is locked in this state by means of a final value pulse EWP via the AND gate 39 and the preparatory input E until the counter reading is set to its starting value by a pulse at the set input S. It is subsequently incremented once again, and the sequence outlined is repeated. The ramp generator 29 obtains the starting value from the ramp generator control device 30 in FIG. 8 via a bus 41 having eight lines 8*.

After a relatively long time without stuffing, the ramp generator control device 30 transmits a starting value R=95. In this state, the starting value R and end value EW of the ramp counter 40 are identical. It therefore remains at the counter reading R=95 even when it is set to the starting value via the bus 41. During the counter reading end value of EW=95, the preparatory input E is at zero. Consequently, the NAND gate 33 and the AND gate 35 are blocked and, for their part, drive the AND gate 31 and the OR gate 32 in such a way that the correcting quantity $K_e$ is not changed towards the output 5, as is shown in FIG. 4, sequences a1 and b1.

If, now, positive stuffing +St occurs, the ramp generator control device 30 decreases the starting value to R=95−32=63 and sets the state of the counting direction signal Z at the counting direction control terminal 34 to logic "1". The ramp counter 40 remains locked at first, however, since the preparatory input E has a state of logic "0". The effect of the state of logic "1" of the counting direction signal Z is that the pulse-pause sequence of the correcting quantity $K_e$ is present unchanged at the output of the exclusive NOR gate 36.

The state of the ramp counter 40 firstly remains unchanged during a state of logic "1" of a pulse-pause sequence of a correcting quantity $K_e$. The ramp counter 40 is set to a starting value of R=63 during the following pause with the logic state "0". The preparatory input E remains, however, at logic "0", since the output of the exclusive NOR gate 36 also has the logic state of "0". The output of AND gate 39 goes to logic "1" with the start of the following pulse of the correcting quantity $K_e$, resulting in the release of the ramp counter 40. The switching on of the two D-type flip-flops 37 and 38 is technically determined and prevents metastable states. The state of logic "1" at the output of the AND gate 39 blocks the AND gate 31 via the NAND gate 33, resulting in a state of logic "0" for the correcting quantity $K_a$. The ramp counter 40 increases its counter reading by one with each period of the auxiliary clock pulse $T_H$. It reaches the value 95 after thirty-two periods. If the final value pulse EWP changes to a state of logic "1", the output of the AND gate 39 goes to a state of logic "0", and the ramp counter 40 remains stationary at the state 95. At the same time, the AND gate 31 is released via the NAND gate 33, resulting in a state of logic "1" for the correcting quantity $K_a$. The frequency of the auxiliary clock pulse $T_H$ and changes in the starting value R after stuffing must be tuned such that the integration time of the ramp counter 40 corresponds precisely to the temporal delay in the falling edge of the pulse-pause sequence c1 in FIG. 4. During the following pause of the correcting quantity $K_e$, the ramp counter 40 is set once again to the starting value R and the sequence is repeated. The ramp generator control device 30 now increases the starting value R at regular intervals in each case by one until the value of R=95 is reached once again, unless the starting value R has previously been changed appropriately by a new stuffing process. This sequence is shown by the sequences c1 and d1 in FIG. 4.

The process proceeds correspondingly after negative stuffing −St. The ramp generator control device 30 sets the state of the counting direction signal Z at the counting direction control terminal 34 to logic "0". The correcting quantity $K_e$ is present inverted at the output of the exclusive NOR gate 36. By contrast with positive stuffing +St, the AND gate 31 remains permanently open. Controlled via the AND gate 35 and OR gate 32, the pulse duration is lengthened by the falling edge of the correcting quantity $K_e$. See the sequences e1 and f1 in FIG. 4.

FIG. 9 shows initial values A and starting values R for a relatively long sequence without stopping up to the instant t1, for positive stuffing +St up to the instant t1, for negative stuffing −St up to the instants t2 and t3, and for a compensated response between the instants t4 and t5. One compensation process was interrupted prematurely in each case at the instants t1, t2 and t3.

FIG. 8 shows the ramp generator control device 30. The latter contains a multiplexer 42 operating as a data selector, a full adder 45, an 8-bit initial value counter 47, a counting direction control circuit 53, a ramp clock pulse control circuit 56, an adder 64 and an adder control 73.

The counting direction control circuit 53 contains AND gates 54 and 55. The ramp clock pulse control circuit 56 has a 3:1/1:1 divider 57, OR gates 60 and 62 as well as AND gates 61 and 63. The adder 64 comprises a full adder 65 and exclusive OR gates 66, 67 and 68. Finally, the adder control 73 contains OR gates 76 and 84, D-type flip-flops 77, 78, 79, 81 and 82, exclusive OR gates 80 and 87 as well as AND gates 83, 85 and 86.

The core of the ramp generator control device 30 is formed by the initial value counter 47. The latter is a commercially available counter whose upwards or downwards counting direction depends on the logic state "1" or "0" of the counting direction control terminal 34. Counting is upwards in the chosen example for the state of logic "1". The clock pulse driving the initial value counter 47 is the ramp clock pulse $T_R$ which is present at the ramp clock pulse input 48 and whose frequency determines the counting rate. Present as a binary number at the output-side bus 43 of the initial value counter 47 is a counter reading A thereof.

The binary number "01100000", whose digit positions are designated by A7 to A0, corresponds to the average decimal initial value of A=96. Thus, A7=0, A6=1 and A5=1.

If these values for A5, A6 and A7 are applied to the AND gates 54 and 55, a logic state of "0" occurs at the output 34 of the AND gate 54, which effects a downwards counting of the initial value counter 47. For decimal values A<96, A7=0, and A6 and A5 are not both one. Given this combination, a state of logic "1" occurs at the output 34 of the AND gate 54, which triggers upwards counting of the initial value counter 47. The consequence of this is that the counter reading of the initial value counter 47 changes periodically with the ramp clock pulse TR between the decimal values A=96 and A=95 as long as no charging pulse LP occurs at the charging pulse input 52.

After the occurrence of charging pulse LP, the counter reading of the initial value counter 47 changes to the code word L5, L6 and L7 present at the charging inputs 49 to 51. Thus, A7 assumes the value L7, A6 that of L6, and A5 that of L5. The values of A4 to A0 are not changed.

The generation of the charging pulse LP and the correct setting of the state of the control input 72 of the adder circuit 64 takes place in the adder control 73. If in the latter either a logic "1" for a negative stuffing −St is applied to the input 74, or the logic "1" for positive stuffing +St is applied to the input 75, the output of the OR gate 76 likewise assumes the state of logic "1". This state is transmitted with the aid of the auxiliary clock pulse $T_H$ at the auxiliary clock pulse input 28a in a stepwise fashion via the D-type flip-flops 77, 78 and 79. If the logic "1" is present at the Q output of the D-type flip-flop 77 and a logic "0" at the Q-output of the D-type flip-flop 79, or vice versa, the exclusive OR gate 87 transmits a logic "1" to the AND gate 86. If, furthermore, a logic "1" is present at the input 75, a logic "1" likewise occurs at the control input 72.

When different logic states are present at the Q output of the D-type flip-flop 78 and at the Q output of the D-type flip-flop 79, the exclusive OR gate 80 transmits a logic "1". The latter is transmitted with the aid of the auxiliary clock pulse $T_H$ in a stepwise fashion via the D-type flip-flops 81 and 82 to the first input of the AND gate 83. If a logic state of "1" is simultaneously present at the input 75, a logic "1" likewise occurs at the output of the AND gate 83. If this is the case, or if the output of the exclusive OR gate 80 is in the state of logic "1", the OR gate 84 passes this state on to the first input of the AND gate 85. If, now, the output of the OR gate 76 is simultaneously in the state of logic "1", the AND gate 85 transmits a charging pulse LP to the charging pulse input 52 of the initial value counter 47.

In the adder 64, the adder input 69 is set to the state of logic "1", the adder input 70 to the state of logic "0", and the adder input 71 to the state of logic "0".

In the case of negative byte stuffing—which corresponds to an acceleration of the incoming data D by eight UI—the decimal initial value A must be increased by thirty-two.

If, in the case of negative byte stuffing −St, the control input 72 receives a logic "0" at the control input 72, a logic "1" occurs at the output of the exclusive OR gate 66, a logic "0" appears at the output of the exclusive OR gate 67, and a logic "0" appears at the output of the exclusive OR gate 68. The code word formed by the three exclusive OR gates 66 to 68 then runs, beginning with the most significant digit position, "001". If the code word "011" is used for this purpose for example for A7, A6 and A5, a code word "100" for the decimal number 128 is produced at the charging inputs 51, 50 and 49 of the initial value counter 47 for L7, L6 and L5. The counter reading is increased by decimal thirty-two with the charging pulse LP now following.

In the case of positive byte stuffing +St, the counter reading of the initial value counter 47 must be reduced by a decimal value of thirty-two. If a logic "1" appears for positive byte stuffing +St at the control input 72, the output of the exclusive OR gate 66 receives a logic "0", the output of the exclusive OR gate 67 receives a logic "1", and the output of the exclusive OR gate 68 receives a logic "1". Thus, starting with the most significant digit position a code word "110" is present at the exclusive OR gates 66, 67 and 68. Added to the code word "011" for A7, A6 and A5 selected above as an example, the sum of L7, L6 and L5 produces a code word "001" without carry. This code word, which contains the decimal number thirty-two is accepted with a charging pulse LP at the charging pulse input 52 as the initial value A=32 of the initial value counter 47. In the next period of the auxiliary clock pulse $T_H$ at the auxiliary clock pulse input 28a, the control input 72 receives the logic state of "0". The exclusive OR gate 66 now assumes the logic state of "1", the exclusive OR gate 67 the logic state of "0", and the exclusive OR gate 68 the logic state of "0". The full adder 65 now adds the code words "001" and "001". The result of L7, L6 and L5 is a code word "010". This corresponds to the decimal value 64 and is accepted with the next charging pulse LP at the charging pulse input 52 as the final initial value A by the initial value counter 47.

If a logic "1" is present at the switching input 59, the ramp auxiliary clock pulse $T_{RH}$ is passed and divided in the ramp clock pulse control circuit 56 by the 3:1/1:1 divider 57 as ramp clock pulse $T_R$ to the output 41. If the switching input 59, by contrast, has the logic state of "0", the ramp auxiliary clock pulse $T_{RH}$ is divided 3:1 before it passes to the output 48 as the ramp clock pulse $T_R$. The output of the AND gate 61 now receives a state of "1", if the code word A7, A6 and A5 is either "101", "110" of "111". The output of the AND gate 63 assumes the state of logic "1" when the code word A7, A6 and A5 is "000". The OR gate 60 then supplies the switching input 59 with a logic "1" if a logic "1" is present either at the output of the AND gate 61 or at the output of the AND gate 63. A logic "0" can occur at the switching input 59 only if A7, A6 and A5 form the code words "001" "010" or "011". The decimal values then lie between thirty-two and one hundred and fifty-nine.

The initial value A transmitted by the initial value counter 47 must now be converted to the starting value R of the ramp counter 29. If A<96, the preliminary starting value is simply passed on as the final starting value R via the bus 43, the multiplexer 42 and the bus 41. If A>95, the preliminary starting value is converted in the adder 45 according to the formula R=191-A, by feeding it via the bus 46 the binary number "010", which corresponds to the decimal number 64 in the digital positions A7, A6 and A5, and the result is inverted. The latter is forwarded via the multiplexer 42 and the bus 41.

If no stuffing processes have occurred for a relatively long time, as already described A changes between the decimal numbers 95 and 96. In both cases, however, R=95; the ramp counter 40 is thus constantly fed R=95.

Referring now to FIGS. 7 and 8, the ramp generator (29) has the following elements: a first AND gate (31), whose first input is connected to the input (4) of the phase-jump compensator (7), a first OR gate (32), whose first input is connected to the output of the first AND gate (31) and whose output is connected to the output (5) of the phase-jump compensator (7), a first NAND gate (33), whose first input is connected to a counting direction control terminal (34) and whose output is connected to the second input of the first AND gate (31), a second AND gate (35), whose first inverting input is connected to the counting direction control terminal (34) and whose output is connected to the second input of the first OR gate (32), an exclusive NOR gate (36), whose first input is connected to the input (4) of the phase-jump compensator (7) and whose second input is connected to the counting direction control terminal (34), a first D-type flip-flop (37), whose D input is connected to the output of the exclusive NOR gate (36) and whose clock pulse input is connected to an auxiliary clock pulse input (28b), a second D-type flip-flop (38), whose D input is connected to the Q output of the first D-type flip-flop (37) and whose clock pulse input is connected to the auxiliary clock pulse input (28b), a third AND gate (39), whose first input is connected to the output of the exclusive NOR gate (36) and whose second input is connected to the Q output of the second D-type flip-flop (38), and a ramp counter (40), whose output is connected to a third inverting input of the third AND gate (39), whose inverting set input is connected to the output of the exclusive NOR gate (36), whose preparatory input is connected both to the output of the third AND gate (39) and to the second input of the NAND gate (33) and to the second input of the second AND gate (35), whose clock pulse input is connected to the auxiliary clock pulse input (28b) and whose starting value input is connected to a starting value bus (41).

The ramp generator control device (30) has the following elements: an 8-bit initial value counter (47), whose counting direction control terminal (34) is connected to a counting direction control circuit (53) and to the ramp generator (29), whose ramp clock pulse input (48) is connected to a ramp clock pulse control circuit (56), whose three charging inputs (49, 50, 51) are connected to outputs of an adder (64) for the three most significant bits, whose charging pulse input (52) is connected to an adder control (73), whose eight outputs are connected to a first bus (43), and whose three secondary outputs (86a, 87a, 88a) for the three most significant bits (A7, A6, A5) of the counter reading are connected to the counting direction control circuit (53), the ramp clock pulse control circuit (56) and the adder (64), a first full adder (45), whose eight first inputs are connected via a first bus (43) to the eight outputs of the initial value counter (47), and whose three second inputs for the three most significant bits of a binary number up to 64 are connected to a second bus (46), and a multiplexer (42), whose first inputs are connected to the first bus (43), whose second inverting inputs are connected via a third bus (44) to the eight outputs of the first full adder (45), whose control input is connected to the counting direction control terminal (34), and whose eight outputs are connected to the starting value bus (41).

The counting direction control circuit (53) has the following elements: a fourth AND gate (54), whose first inverting input is connected to the first secondary output (86b) of the initial value counter (47) and whose output is connected to the counting direction control terminal (34), and a fifth AND gate (55) is provided, whose first input is connected to the second secondary output (87b), of the initial value counter (47), whose second input is connected to the third secondary output (88b) of the initial value counter (47), and whose output is connected to the second inverting input of the fourth AND gate (54).

The ramp clock pulse control circuit (56) has the following elements: a switchable 3:1/1:1 divider, which has a ramp auxiliary clock pulse input (58) and a changeover signal input (59), a second OR gate (60), whose output is connected to the changeover signal input (59), a sixth AND gate (61), whose first input is connected to the first secondary output (88c) of the initial value counter (47) and whose output is connected to the first input of the OR gate (60), a third OR gate (62), whose first input is connected to the second secondary output (89c) of the initial value counter (47), whose second input is connected to the third secondary output (90c) of the initial value counter (47) and whose output is connected to the second input of the sixth AND gate (61), and a seventh AND gate (63), whose first inverting input is connected to the first secondary output (88d) of the initial value counter (47), whose second inverting input is connected to the second secondary output (89d) of the initial value counter (47), whose third inverting input is connected to the third secondary output (90d) of the initial value counter (47) and whose output is connected to the second input of the second OR gate (60).

The adder (64) has the following elements: a second full adder (65), whose output is connected to the three charging inputs (49, 50, 51) of the initial value counter (47) and whose inputs (88e, 89e, 90e) are connected to the secondary outputs (88a, 89a, 90a) of the initial value counter (47), a fourth exclusive OR gate (68), whose first input is connected to the control input (72), whose second input is connected to a third adder input (71) and whose output is connected to the first secondary output (88a) of the initial value counter (47), a third exclusive OR gate (67), whose first input is connected to the control input (72), whose second input is connected to a second adder input (70) and whose output is connected to the second secondary output (89a) of the initial value counter (47), and a second exclusive OR gate (66) is provided whose first input is connected to the control input (72), whose second input is connected to a first adder input (69) and whose output is connected to the third secondary output (90a) of the initial value counter (47) of the second full adder (65).

The adder control (73) has the following elements: a fourth OR gate (76), whose first input is connected to an input (74) for negative stuffing (−St) and whose second input is connected to an input (75) for positive stuffing (+St), a third D-type flip-flop (77), whose D input is connected to the output of the fourth OR gate (76) and whose clock pulse input is connected to the auxiliary clock pulse input (28a), a fourth D-type flip-flop (78), whose D input is connected to the Q output of the third D-type flip-flop (77) and whose clock pulse input is connected to the auxiliary clock pulse input (28a), a fifth D-type flip-flop (79), whose D input is connected to the Q output of the fourth D-type flip-flop (78) and whose clock pulse input is connected to the auxiliary clock pulse input (28a), a fifth exclusive OR gate (80), whose first input is connected to the Q output of the fifth D-type flip-flop (79) and whose second input is connected to the Q output of the fourth D-type flip-flop (78), a sixth D-type flip-flop (81), whose D input is connected to the output of the fifth exclusive OR gate (80) and whose clock pulse input is connected to the auxiliary clock pulse input (28a), a seventh D-type flip-flop (82), whose D input is connected to the Q output of the sixth D-type flip-flop (81) and whose clock pulse input is connected to the auxiliary clock pulse input (28a), an eighth AND gate (83), whose first input is connected to the Q output of the seventh D-type flip-flop (82) and whose second input is connected to the input (75) for positive stuffing, a fifth OR gate (84), whose first input is connected to the output of the eighth AND gate (83) and whose second input is connected to the output of the fifth exclusive OR gate (80), a ninth AND gate (85), whose first input is connected to the output of the fifth OR gate (84), whose second input is connected to the output of the fourth OR gate (76)

and whose output is connected to the charging pulse input (52) of the initial value counter (47), a sixth exclusive OR gate (87), whose first input is connected to the Q output of the third D-type flip-flop (77) and whose second input is connected to the Q output of the fifth D-type flip-flop (79), and a tenth AND gate (86) is provided, whose first input is connected to the input (75) for positive stuffing, whose second input is connected to the output of the sixth exclusive OR gate (87) and whose output is connected to the control input (72) of the first adder (64).

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for clock recovering of a received and intermediately stored data which has been matched to a data transmission speed by stuffing processes, comprising the steps of:
   providing a phase-locked loop having a phase discriminator having first and second inputs and an output, said phase-locked loop also having a phase-jump compensator having an output and having an input connected to said output of said phase discriminator, said phase-locked loop also having an oscillator having an input connected to said output of said phase-jump compensator and having an output connected to said second input of said phase discriminator, said first input of said phase discriminator being an input of said phase-locked loop and said output of said oscillator being an output of said phase-locked loop;
   comparing in the phase discriminator a phase of a continuous read clock pulse at said output of said phase-locked loop to a phase of an irregular write clock pulse at said input of said phase-locked loop and providing as a result of the comparison an input correcting quantity to said phase-ump compensator;
   determining from stuffing information of the received data a compensation control signal for a stuffing process which causes a sudden change in said input correcting quantity;
   feeding the compensation control signal to said phase-jump compensator which determines from the input correcting quantity an output correcting quantity by first suppressing sudden changes in the output correcting quantity and then matching the output correcting quantity continuously or in small steps to the input correcting quantity; and
   controlling said oscillator by the output correcting quantity and providing the read clock pulse at the output of said oscillator.

2. The method as claimed in claim 1, wherein the phase-jump compensator generates a compensation signal which is combined with the input correcting quantity to form the output correcting quantity.

3. The method as claimed in claim 1, wherein a rate of change of the output correcting quantity is determined by the input correcting quantity caused by stuffing processes.

4. The method as claimed in claim 1, wherein a binary pulse-pause sequence is generated as the input correcting quantity, in a first case wherein in the event of a lengthening of a binary state of the input correcting signal by a stuffing process a leading edge of said binary state is initially delayed by the compensation signal, and wherein in a second case in the event of a shortening of a binary state of the input correcting signal by a stuffing process the trailing edge of said binary state is initially delayed by the compensation signal, so that in both the first and second cases the pulse-pause ratio remains at first at least approximately the same, and then in both the first and second cases the delay interval of the edges is reduced.

5. A timing recovery device for data which is input by an irregular write clock pulse into a buffer memory and read out by a continuous read clock pulse, comprising:
   a digital oscillator whose frequency is controlled by means of a counting period of a counter, said digital oscillator providing the continuous read clock pulse on an output thereof;
   a phase discriminator having a write counter and a read counter, from whose output signals a binary pulse-pause sequence is obtained as an input correcting quantity;
   a ramp generator having an adjustable ramp counter;
   a ramp generator control device which during each stuffing process adjusts the ramp counter which transmits a compensation signal corresponding to its counting period, the compensation signal being combined via a gate network with the input correcting quantity from the phase discriminator, and transmits an output correcting quantity to the oscillator, and then reduces the compensation signal in a stepwise fashion by reducing the counting period of the ramp counter, and after termination of the counting process transmits a final value pulse which switches through the input correcting quantity as the output correcting quantity to the oscillator.

6. The timing recovery device as claimed in claim 5, wherein the ramp generator control device has an adjustable initial value counter, upstream of whose adjusting inputs a full adder is connected and whose counter reading is increased or decreased during each stuffing process by a constant amount, and whose counter reading determines an adjustment value of the ramp counter and changes said adjustment value in a stepwise fashion between the stuffing processes.

7. The timing recovery device as claimed in claim 5, wherein switchable divider is connected upstream of the clock pulse input of the initial value counter, the switchable divider having a division ratio switchable as a function of the counter reading of the initial value counter and thereby effecting changes of different rapidity in the compensation signal.

8. The timing recovery device as claimed in claim 5, wherein the ramp generator and the ramp generator control device form a phase-jump compensator having an input for receiving the input correcting quantity and an output for providing the output correcting quantity wherein the ramp generator has a first AND gate having a first input connected to the input of the phase-jump compensator, a first OR gate having a first input connected to an output of the first AND gate and having an output connected to the output of the phase-jump compensator, a first NAND gate having a first input connected to a counting direction control terminal and having an output connected to a second input of the first AND gate, a second AND gate having a first inverting input connected to the counting direction control terminal and having an output connected to a second input of the first OR gate, an exclusive NOR gate having a first input connected to the input of the phase-jump compensator and having a second input connected to the counting direction control terminal, a first D-type flip-flop having a D input connected to an output of the exclusive NOR gate and having a clock pulse input connected to an auxiliary clock pulse input, a second D-type flip-flop having a D input connected to Q output of the first D-type flip-flop and having a clock pulse input connected to the auxiliary clock pulse input a third AND gate having a first input connected to the output of the exclusive NOR gate and having a second input connected to Q output of the second D-type flip-flop, and a ramp counter having an output connected to a third inverting input of the third AND gate, having an inverting set input connected to the output of the exclusive NOR gate, having a preparatory input connected to an output of the third AND gate and to a second input of the first NAND gate and to second input of the second AND gate, having a clock pulse input connected to the auxiliary clock pulse input and having a starting value input connected to a starting value bus.

9. The timing recovery device as claimed in claim 5, wherein the ramp generator and the ramp generator control device form a phase-jump compensator having an input for receiving the input correcting quantity and an output for providing the output correcting quantity, wherein the ramp generator control device has an 8-bit initial value counter and a multiplexer, said value counter having a counting direction control terminal connected to a counting direction control circuit and to the ramp generator, having a ramp clock pulse input connected to a ramp clock pulse control circuit, having three charging inputs connected to outputs of an adder for the three most significant bits, having a charging pulse input connected to an adder control, having eight outputs connected to a first bus, and having three secondary outputs for the three most significant bits of the counter reading connected to the counting direction control circuit, to the ramp clock pulse control circuit and to the adder, a first full adder having eight first inputs connected via a first bus to the eight outputs of the initial value counter and having three second inputs for the three most significant bits of a binary number up to 64 connected to a second bus, and said multiplexer having first inputs connected to the first bus, having second inverting inputs connected via a third bus to eight outputs of the first full adder, having a control input connected to the counting direction control terminal, and having eight outputs connected to a starting value bus.

10. The timing recovery device as claimed in claim 9, wherein the counting direction control circuit has a first AND gate having a first inverting input connected to the first secondary output of the initial value counter and having an output connected to the counting direction control terminal, and a second AND gate having a first input connected to the second secondary output of the initial value counter, having a second input connected to the third secondary output of the initial value counter, and having an output connected to a second inverting input of the first AND gate.

11. The timing recovery device as claimed in claim 9, wherein the ramp clock pulse control circuit has a switchable 3:1/1:1 divider having a ramp auxiliary clock pulse input and a changeover signal input, a first OR gate having an output connected to the changeover signal input, a first AND gate having a first input connected to the first secondary output of the initial value counter and having an output connected to a first input of the first OR gate, a second OR gate having a first input connected to the second secondary output of the initial value counter, having a second input connected to the third secondary output of the initial value counter and having an output connected to a second input of the first AND gate, and a second AND gate having a first inverting input connected to the first secondary output of the initial value counter, having a second inverting input connected to the second secondary output of the initial value counter, having a third inverting input connected to the third secondary output of the initial value counter and having an output connected to a second input of the first OR gate.

12. The timing recovery device as claimed in claim 9, wherein the adder has a second full adder having outputs connected to the three charging inputs of the initial value counter and having inputs connected to the secondary outputs of the initial value counter, a first exclusive OR gate having a first input connected to a control input, having a second input connected to a third adder input and having an output connected to the first secondary output of the initial value counter, a third exclusive OR gate having a first input connected to the control input, having a second input connected to a second adder input and having an output connected to the second secondary output of the initial value counter, and a second exclusive OR gate having a first input connected to the control input, having a second input connected to a first adder input and having an output connected to the third secondary output of the initial value counter.

13. The timing recovery device as claimed in claim 9, wherein the adder control has a first OR gate having a first input connected to an input for negative stuffing and having a second input connected to an input for positive stuffing, a first D-type flip-flop having a D input connected to an output of the first OR gate and having a clock pulse input connected to the auxiliary clock pulse input, a second D-type flip-flop having a D input connected to a Q output of the first D-type flip-flop and having a clock pulse input connected to the auxiliary clock pulse input, a third D-type flip-flop having a D input connected to a Q output of the second D-type flip-flop and having a clock pulse input connected to the auxiliary clock pulse input, a first exclusive OR gate having a first input connected to a Q output of the third D-type flip-flop and having a second input connected to the Q output of the second D-type flip-flop, a fourth D-type flip-flop having a D input connected to an output of the first exclusive OR gate and having a clock pulse input connected to the auxiliary clock pulse input, a fifth D-type flip-flop having a D input connected to a Q output of the fourth D-type flip-flop and having a clock pulse input connected to the auxiliary clock pulse input, a first AND gate having a first input connected to a Q output of the fifth D-type flip-flop and having a second input connected to the input for positive stuffing, a second OR gate having a first input connected to an output of the first AND gate and having a second input connected to the output of the first exclusive OR gate, a second AND gate having a first input connected to an output of the second OR gate, having a second input connected to the output of the first OR gate and having an output connected to the charging pulse input of the initial value counter, a second exclusive OR gate having a first input connected to the Q output of the first D-type flip-flop and having a second input connected to the Q output of the third D-type flip-flop, and a third AND gate having a first input connected to the input for positive stuffing, having a second input connected to an output of the second exclusive OR gate and having an output connected to the control input of the adder.

14. A clock recovery circuit for data which is input by an irregular write clock pulse into a buffer memory and read out by a continuous read clock pulse, comprising:
   a phase-locked loop having an oscillator and a phase discriminator, the phase discriminator receiving the write clock pulse and the read clock pulse as input signals and providing as an output signal an input correcting quantity to the oscillator;
   said oscillator having a phase-locked loop counter for controlling a frequency of the oscillator by means of a counting period;
   said phase discriminator having a write counter and a read counter from whose output signals a binary pulse-pause-sequence is obtained as the input correcting quantity;
   a ramp generator having an adjustable ramp counter;
   a ramp generator control circuit which, during each stuffing process, adjusts the ramp counter which provides a compensation signal corresponding to its counting period, the compensation signal being combined via a gate network with the input correcting quantity from the phase discriminator to provide an output correcting quantity for the oscillator, the ramp generator control circuit then reducing the compensation signal step by step by reducing the counting period of the ramp counter, which after termination of the counting process provides a final value pulse which causes a switch of the input correcting quantity as the output correcting quantity to the oscillator.

15. The timing recovery device as claimed in claim 14, wherein the ramp generator control device has an adjustable initial value counter, upstream of whose adjusting inputs a full adder is connected and whose counter reading is increased or decreased during each stuffing process by a constant amount, and whose counter reading determines an adjustment value of the ramp counter and changes said adjustment value in a stepwise fashion between the stuffing processes.

16. The timing recovery device as claimed in claim 14, wherein a switchable divider is connected upstream of the clock pulse input of the initial value counter is a switchable divider, the switchable divider having a division ratio switchable as a function of the counter reading of the initial value counter and thereby effecting changes of different rapidity in the compensation signal.

17. The timing recovery device as claimed in claim 14, wherein the ramp generator and the ramp generator control device form a phase-jump compensator having an input for receiving the input correcting quantity and an output for providing the output correcting quantity, wherein the ramp generator has a first AND gate having a first input connected to the input of the phase-jump compensator, a first OR gate having a first input connected to an output of the first AND gate and having an output connected to the output of the phase-jump compensator, a first NAND gate having a first input connected to a counting direction control terminal and having an output connected to a second input of the first AND gate, a second AND gate, having a first inverting input connected to the counting direction control terminal and having an output connected to a second input of the first OR gate, an exclusive NOR gate having a first input connected to the input of the phase-jump compensator and having a second input connected to the counting direction control terminal, a first D-type flip-flop having a D input connected to an output of the exclusive NOR gate and having a clock pulse input connected to an auxiliary clock pulse input, a second D-type flip-flop having a D input connected to a Q output of the first D-type flip-flop and having a clock pulse input connected to the auxiliary clock pulse input, a third AND gate having a first input connected to the output of the exclusive NOR gate and having a second input connected to a Q output of the second D-type flip-flop, and a ramp counter having an output connected to a third inverting input of the third AND gate, having an inverting set input connected to the output of the exclusive NOR gate, having a preparatory input connected to an output of the third AND gate and to a second input of the first NAND gate and to a second input of the second AND gate, having a clock pulse input connected to the auxiliary clock pulse input and having a starting value input connected to a starting value bus.

18. The timing recovery device as claimed in claim 14, wherein the ramp generator and the ramp generator control device form a phase-jump compensator having an input for receiving the input correcting quantity and an output for providing the output correcting quantity, wherein the ramp generator control device has an 8-bit initial value counter and a multiplexer, said value counter having a counting direction control terminal connected to a counting direction control circuit and to the ramp generator, having a ramp clock pulse input connected to a ramp clock pulse control circuit, having three charging inputs connected to outputs of an adder for the three most significant bits, having a charging pulse input connected to an adder control, having eight outputs connected to a first bus, and having three secondary outputs for the three most significant bits of the counter reading connected to the counting direction control circuit, to the ramp clock pulse control circuit and to the adder, a first full adder having eight first inputs connected via a first bus to the eight outputs of the initial value counter and having three second inputs for the three most significant bits of a binary number up to 64 connected to a second bus, and said multiplexer having first inputs connected to the first bus, having second inverting inputs connected via a third bus to eight outputs of the first full adder, having a control input connected to the counting direction control terminal, and having eight outputs connected to a starting value bus.

19. The timing recovery device as claimed in claim 18, wherein the counting direction control circuit has a first AND gate having a first inverting input connected to the first secondary output of the initial value counter and having an output connected to the counting direction control terminal, and a second AND gate having a first input connected to the second secondary output of the initial value counter, having a second input connected to the third secondary output of the initial value counter, and having an output connected to a second inverting input of the first AND gate.

20. The timing recovery device as claimed in claim 18, wherein the ramp clock pulse control circuit has a switchable 3:1/1:1 divider having a ramp auxiliary clock pulse input and a changeover signal input, a first OR gate having an output connected to the changeover signal input, a first AND gate having a first input connected to the first secondary output of the initial value counter and having an output connected to a first input of the first OR gate, a second OR gate having a first input connected to the second secondary output of the initial value counter, having a second input connected to the third secondary output of the initial value counter and having an output connected to a second input of the first AND gate, and a second AND gate having a first inverting input connected to the first secondary output of the initial value counter, having a second inverting input connected to the second secondary output of the initial value counter, having a third inverting input connected to the third secondary output of the initial value counter and having an output connected to a second input of the first OR gate.

21. The timing recovery device as claimed in claim 18, wherein the adder has a second full adder having outputs connected to the three charging inputs of the initial value counter and having inputs connected to the secondary outputs of the initial value counter, a first exclusive OR gate having a first input connected to a control input, having a second input connected to a third adder input and having an output connected to the first secondary output of the initial value counter, a third exclusive OR gate having a first input connected to the control input, having a second input connected to a second adder input and having an output connected to the second secondary output of the initial value counter, and a second exclusive OR gate having a first input connected to the control input, having a second input connected to a first adder input and having an output connected to the third secondary output of the initial value counter.

22. The timing recovery device as claimed in claim 18, wherein the adder control has a first OR gate having a first input connected to an input for negative stuffing and having a second input connected to an input for positive stuffing, a first D-type flip-flop having a D input connected to an output of the first OR gate and having a clock pulse input connected to the auxiliary clock pulse input, a second D-type flip-flop having a D input connected to a Q output of the first D-type flip-flop and having a clock pulse input connected to the auxiliary clock pulse input, a third D-type flip-flop having a D input connected to a Q output of the second D-type flip-flop and having a clock pulse input connected to the auxiliary clock pulse input, a first exclusive OR gate having a first input connected to a Q output of the third D-type flip-flop and having a second input connected to the Q output of the second D-type flip-flop, a fourth D-type flip-flop having a D input connected to an output of the first exclusive OR gate and having a clock pulse input connected to the auxiliary clock pulse input, a fifth D-type flip-flop having a D input connected to a Q output of the fourth D-type flip-flop and having a clock pulse input connected to the auxiliary clock pulse input, a first AND gate having a first input connected to a Q output of the fifth D-type flip-flop and having a second input connected to the input for positive stuffing, a second OR gate having a first input connected to an output of the first AND gate and having a second input connected to the output of the first exclusive OR gate, a second AND gate having a first input connected to an output of the second OR gate, having a second input connected to the output of the first OR gate and having an output connected to the charging pulse input of the initial value counter, a second exclusive OR gate having a first input connected to the Q output of the first D-type flip-flop and having a second input connected to the Q output of the third D-type flip-flop, and a third AND gate having a first input connected to the input for positive stuffing, having a second input connected to an output of the second exclusive OR gate and having an output connected to the control input of the adder.

* * * * *